United States Patent
Wang et al.

(10) Patent No.: US 9,681,536 B1
(45) Date of Patent: Jun. 13, 2017

(54) PACKAGE SUBSTRATE AND METHOD FOR FABRICATING THE SAME

(71) Applicant: Unimicron Technology Corp., Taoyuan (TW)

(72) Inventors: Ying-Tung Wang, Hsinchu County (TW); Yu-Ying Chao, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/249,472

(22) Filed: Aug. 28, 2016

(51) Int. Cl.
| | |
|---|---|
| H05K 1/16 | (2006.01) |
| H05K 1/02 | (2006.01) |
| H05K 3/40 | (2006.01) |
| H05K 1/11 | (2006.01) |
| H01L 21/48 | (2006.01) |
| H01L 23/498 | (2006.01) |

(52) U.S. Cl.
CPC ......... *H05K 1/0231* (2013.01); *H01L 21/486* (2013.01); *H01L 21/4857* (2013.01); *H01L 23/49822* (2013.01); *H01L 23/49827* (2013.01); *H01L 23/49838* (2013.01); *H05K 1/0298* (2013.01); *H05K 1/116* (2013.01); *H05K 3/4038* (2013.01)

(58) Field of Classification Search
CPC ..................................................... H05K 1/162
See application file for complete search history.

(56) References Cited

FOREIGN PATENT DOCUMENTS

| CN | 1581370 A | 2/2005 |
|---|---|---|
| CN | 101998770 A | 3/2011 |

*Primary Examiner* — Jeremy C Norris
(74) *Attorney, Agent, or Firm* — CKC & Partners Co., Ltd.

(57) ABSTRACT

Method of fabricating package substrates includes providing a substrate including a capacitance layer sandwiched between first patterned circuits and second patterned circuit, in which a gap is formed between adjacent two of the first patterned circuits, and exposed a first region of the capacitance layer, and the second patterned circuit is overlapped with the first region; removing a part of the capacitance layer within the first region, to form an opening communicated with the gap; forming a dielectric layer from a side of the capacitance layer disposed with the first patterned circuits to fill up the gap and the opening; and removing a part of the dielectric layer within the gap and the opening to form a through hole to expose a part of the second patterned circuit, the remaining part of the first dielectric layer covers the capacitance layer and the first patterned circuits.

15 Claims, 4 Drawing Sheets

PACKAGE SUBSTRATE AND METHOD FOR FABRICATING THE SAME

BACKGROUND

Field of Invention

The present disclosure relates to a method of fabricating a package substrate. More particularly, the present disclosure relates to a method of fabricating a feature of the capacitance layer embedded inside a package substrate.

Description of Related Art

With the advancement of process techniques for fabricating integrated-circuits (ICs), demands related to improvement of the performance of ICs, such as routing density, transmission rate, and signal interference prevention, as well as other improvements, have become increasingly important. Owing to ICs becoming more and more compactly integrated under the improvement of miniaturization processes, most of the semiconductor packages fabricated by the advanced packaging processes need to adopt an IC carrier interconnected between the IC and the printed circuit board, in which the IC carrier may be regarded as a package substrate. More specifically, some specific fabricating processes need to be implemented on the already-manufactured IC for connecting the IC with other electronic components, such as back end of line (BEOL) process and packaging process among other processes. Interconnecting routes of the IC carrier may be adopted to connect ICs with the printed circuit board, to communicate electrical signals between the ICs and the printed circuit board; and moreover, the IC carrier may further adopt to protect the conductive routes and dissipate heat generated by components within a semiconductor package. As a consequence, when the electrical signals communicated between ICs and the printed circuit board require the IC carrier to transmit electrical signals, the working efficiency of a semiconductor packages is greatly dependent on transmission quality of the IC carrier.

However, an IC carrier fabricated by conventional methods may generate protruding parts inside through holes fabricated within a capacitance film of the, IC carriers while patterning the capacitance film, so that the heat and the exerted-forces generated by subsequent processes may be accumulated on the protruding parts; and moreover, the accumulated heat and the exerted-forces may induce the holes within the capacitance film which may, in turn, become cracked or damaged. Furthermore, the cracked or damaged holes may influence transmission quality of the IC carrier. Therefore, in the conventional fabrication of semiconductor packages and the available structure of semiconductor packages, as described above, apparently there exists inconvenience and defect, which needs further improvement. To deal with the aforesaid problem, practitioners with ordinary skill in the art have striven to attain a solution, though a suitable solution is still to be developed. Therefore, to deal with the aforesaid problem effectively is an important subject of research and development, and also a desired improvement in the art.

SUMMARY

The present disclosure provides a method for fabricating a package substrate. The method includes: providing a substrate including a capacitance layer having a first side and a second side opposite to the first side, first patterned circuits disposed on the first side, and at least one second patterned circuit disposed on the second side, in which a gap is formed between adjacent two of the first patterned circuits, and exposed a first region of the capacitance layer, and the second patterned circuit overlaps with at least a part of the first region; subsequently, removing at least one part of the capacitance layer overlapping with the second patterned circuit within the first region, to form an opening communicated with the gap; subsequently, forming a first dielectric layer from the first side to substantially fill up the gap and the opening; and then removing a part of the first dielectric layer within the gap and the opening to form a first through hole and expose a part of the second patterned circuit in the first through hole, in which the remaining part of the first dielectric layer covers the capacitance layer and the first patterned circuits.

The present disclosure provides a package substrate. The package substrate includes a capacitance layer, first patterned circuits, at least one second patterned circuit, a dielectric layer, and a conductive material. The capacitance layer has an opening, a first side, and a second side opposite to the first side. The first patterned circuits are disposed on the first side, and adjacent two of the first patterned circuits have a gap formed in-between, in which the opening is located within the gap. The second patterned circuit is disposed on the second side, and the second patterned circuit at least covers the opening from the second side. The dielectric layer is disposed on the first side and covering the capacitance layer and the first patterned circuits. The dielectric layer may have a first through hole formed within, in which the first through hole is extended through the gap and the opening, and reaches the second patterned circuit. The conductive material may be disposed inside the first through hole, and extended between the second patterned circuit and a surface of the dielectric layer away from the capacitance layer, in which the dielectric layer is insulated between the capacitance layer and the conductive material.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
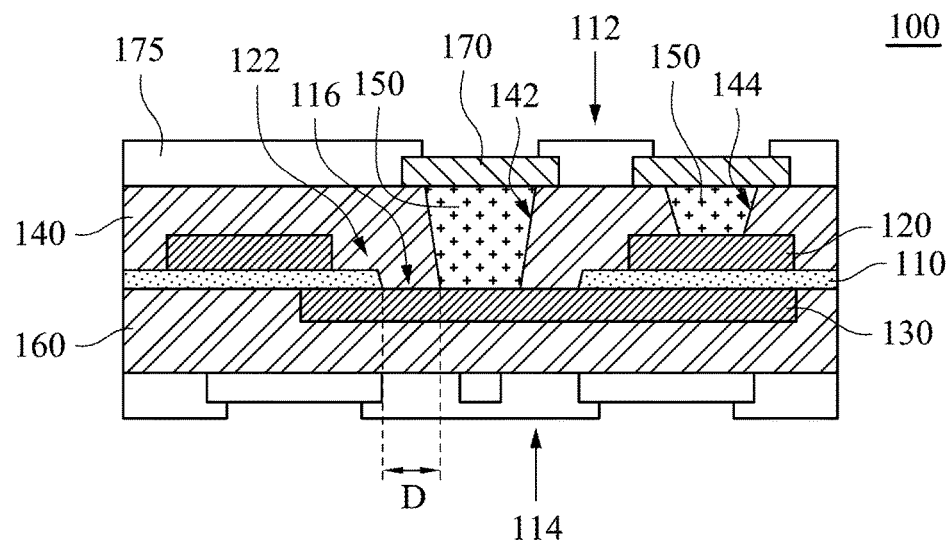
FIG. 1 is a simplified fragmentary cross-sectional view of a package substrate according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompass both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Reference is made to FIG. 1. FIG. 1 illustrates a simplified fragmentary cross-sectional view of a package substrate 100 according to some embodiments of the present disclosure. As shown in FIG. 1, the package substrate 100 may include a capacitance layer 110, first patterned circuits 120, second patterned circuit 130, a first dielectric layer 140, and a conductive material 150. The capacitance layer has a first side 112, a second side 114 opposite to the first side 112, and an opening 116. In some embodiments, the first patterned circuits 120 are disposed on the first side 112, and adjacent two of the first patterned circuits 120 have a gap 122 formed in-between. The opening 116 is located within the gap 122. In other words, the opening 116 is located within a vertical projection of the gap 122 on the capacitance layer 110. The second patterned circuit 130 is disposed on the second side 114, and the second patterned circuit 130 at least covers the opening 116 from the second side 114.

The first dielectric layer 140 can be disposed on the first side 112 and cover the capacitance layer 110 and the first patterned circuits 120. In other embodiments, the first dielectric layer 140 may cover a part of the first patterned circuits 120 surrounded the gap 122, a part of the capacitance layer 110 exposed in the gap 122, and a part of the capacitance layer 110 surrounded the opening 116, to the least extent. In some embodiments, the first dielectric layer 140 may have a first through hole 142 formed within. The first through hole 142 can be extended through the gap 122 and the opening 116, and reached the second patterned circuit, in which the remaining part of the first dielectric layer 140 is located between the capacitance layer 110 and the first through hole 142. In some embodiments, the conductive material 150 may be disposed inside the first through hole 142, and extended between the second patterned circuit 130 and a surface of the dielectric layer 140 away from the capacitance layer 110. In some embodiments, the first dielectric layer 140 may function as an insulated layer between various components. For example, the first dielectric layer 140 can insulate between the capacitance layer 110 and the conductive material 150. In some embodiments, in the gap 122, the remaining part of the first dielectric layer 140 may be located between the first patterned circuits 120 and the first through hole 142, in which the first dielectric layer 140 is also insulated between the first patterned circuits 120 and the conductive material 150.

Owing to the first dielectric layer 140 is disposed between the inner wall of the first through hole 142 and the capacitance layer 110 in the package substrate 100, the first dielectric layer 140 can electrically insulate between the capacitance layer 110 and the conductive material 150 disposed within the first through hole 142. Additionally, the first dielectric layer 140 may further electrically insulate the first patterned circuits 120 and the conductive material 150. Therefore, when electrical signals are transmitted from the second patterned circuit 130 to the surface of the first dielectric layer 140 away from the capacitance layer 110 through the conductive material 150 inside the first through hole 142, the first dielectric layer 140 can avoid or reduce leakage or capacitive resistance influenced the electrical signals, and further improve transmission quality of the electrical signals; and moreover, the first dielectric layer 140 may also decrease influence to electrical signals transmitted through the first patterned circuits 120. That is, the part of the first dielectric layer 140 disposed between the conductive material 150 and the inner wall of the opening 116 can avoid or reduce the electrical signals, transmitted through the first patterned circuits 120 and the second patterned circuit 130, electrical leakage or electrical signal distortion may occur, so that the transmission quality of the package substrate 100 transmitted electrical signals may further be improved.

In addition, owing to the first dielectric layer 140 covers a part of the capacitance layer 110 exposed in the gap 122 and the opening 116, such as the part of the capacitance layer overlapped with the gap 122 and the inner wall of the opening 116, the first dielectric layer 140 can avoid or reduce heats and exerted-forces generated by the fabricating processes accumulated on the inner wall of the opening 116. More specifically, fabricating processes, for example, a laser ablation process, a desmear process and/or plating metal process, etc., adopted to form the components of the package substrate 100, such as the first through hole 142 and the conductive material 150, can be performed, and heat and exerted-forces being generated may be distributed more homogeneously instead of collectively accumulated on the protruding part of the opening 116. That is, the opening 116 of the capacitance layer 110 may avoid or reduce being cracked or damaged in the manner that covering the capacitance layer 110 with the first dielectric layer 140 to prevent the opening 1116 from accumulated the heats or the exerted-forces. Therefore, the sequential forming process may improve the electrical properties and the transmission quality of the package substrate 100, and also increase the yield rate of the fabrication.

As shown in FIG. 1, in some embodiments, a distance D between the border of the opening and the border of the conductive material located within the first through hole can be greater than or substantially equal to 5 µm. It should be noted that the distance D, described herein, is only an exemplary, and not intended to limit the present disclosure. For example, in other embodiments, the distance D can be less than 10 µm. In other embodiments, the distance D can be less than 200 µm. It should be understood that those skilled in the art may make various changes and alterations to the distance D without departing from the spirit and scope of the present disclosure to fulfill the actual demand. For example, the distance D may also be less than 75 µm, 100 µm, 300 µm, or follow other suitable restriction. That is, the prerequisite of the distance D is that the first dielectric layer 140 can electrically insulate the conductive material 150 and the capacitance layer 110, to avoid or reduce electricity leakage or parasitic capacitance being generated while electrical signals are transmitted.

In some embodiments, the first dielectric layer 140 may further have a second through hole 144 formed within, such that the second through hole 144 is correspondingly formed to expose one of the first patterned circuits 120. In some embodiments, the conductive material 150 may further be disposed inside the second through hole 144, and extended between the corresponded first patterned circuit 120 and a surface of the first dielectric layer 140 away from the capacitance layer 110.

In some embodiments, the package substrate 100 may further include a second dielectric layer 160, disposed on the second side 114 of the package substrate 100. In some embodiments, the second dielectric layer 160 can encapsulate the second patterned circuit 130, to avoid the second patterned circuit 130 being exposed to the circumstance. In some embodiments, the first dielectric layer 140 and the second dielectric layer 160 can be formed in the same process, for example, a lamination process or other suitable process.

In some embodiments, the package substrate 100 may further include a third patterned circuits 170, disposed on a surface of the conductive material 150 away from the capacitance layer 110. In some embodiments, the third patterned circuits 170 may include conducting electrodes configured to connect to other components. In some embodiments, the third patterned circuits 170 may include conducting electrodes and/or grounding electrodes. In some embodiments, the second patterned circuit 130 may be connected to one of the third patterned circuits 170 functioned as the grounding electrode.

Figure 2:
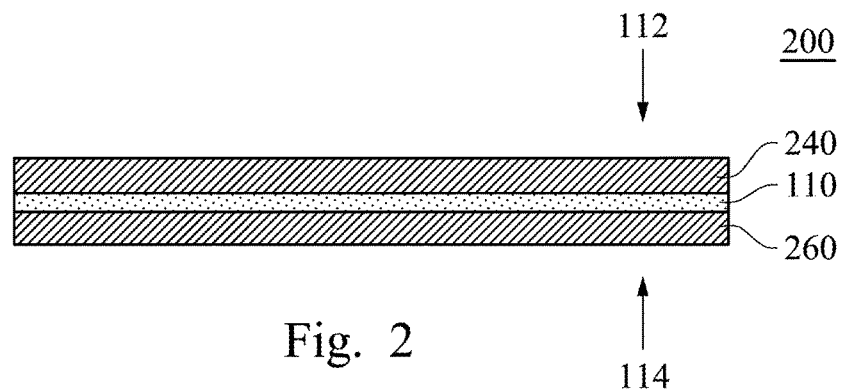
FIG. 2 to FIG. 9 are simplified fragmentary cross-sectional views of a package substrate at various stages according to some embodiments of the present disclosure.
Figure 8:
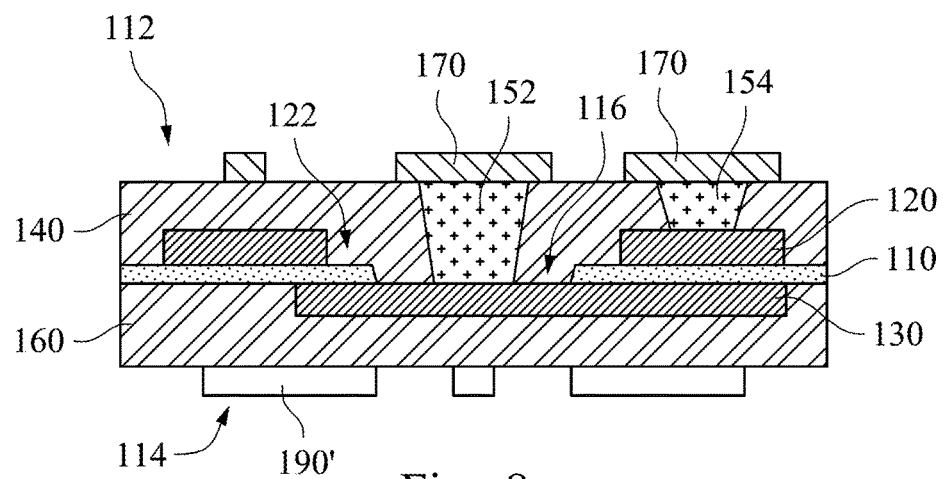
Figure 9:
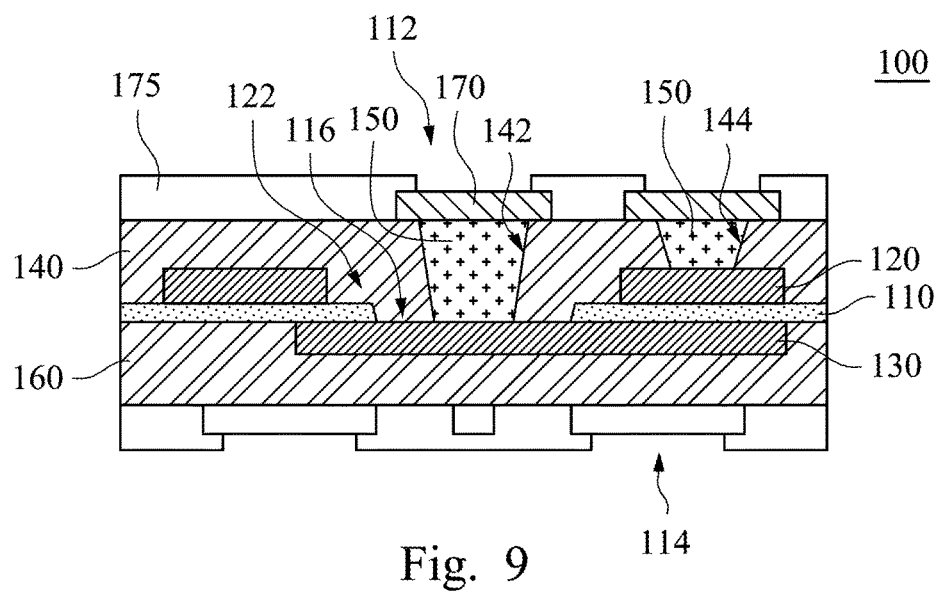
Figure 10:
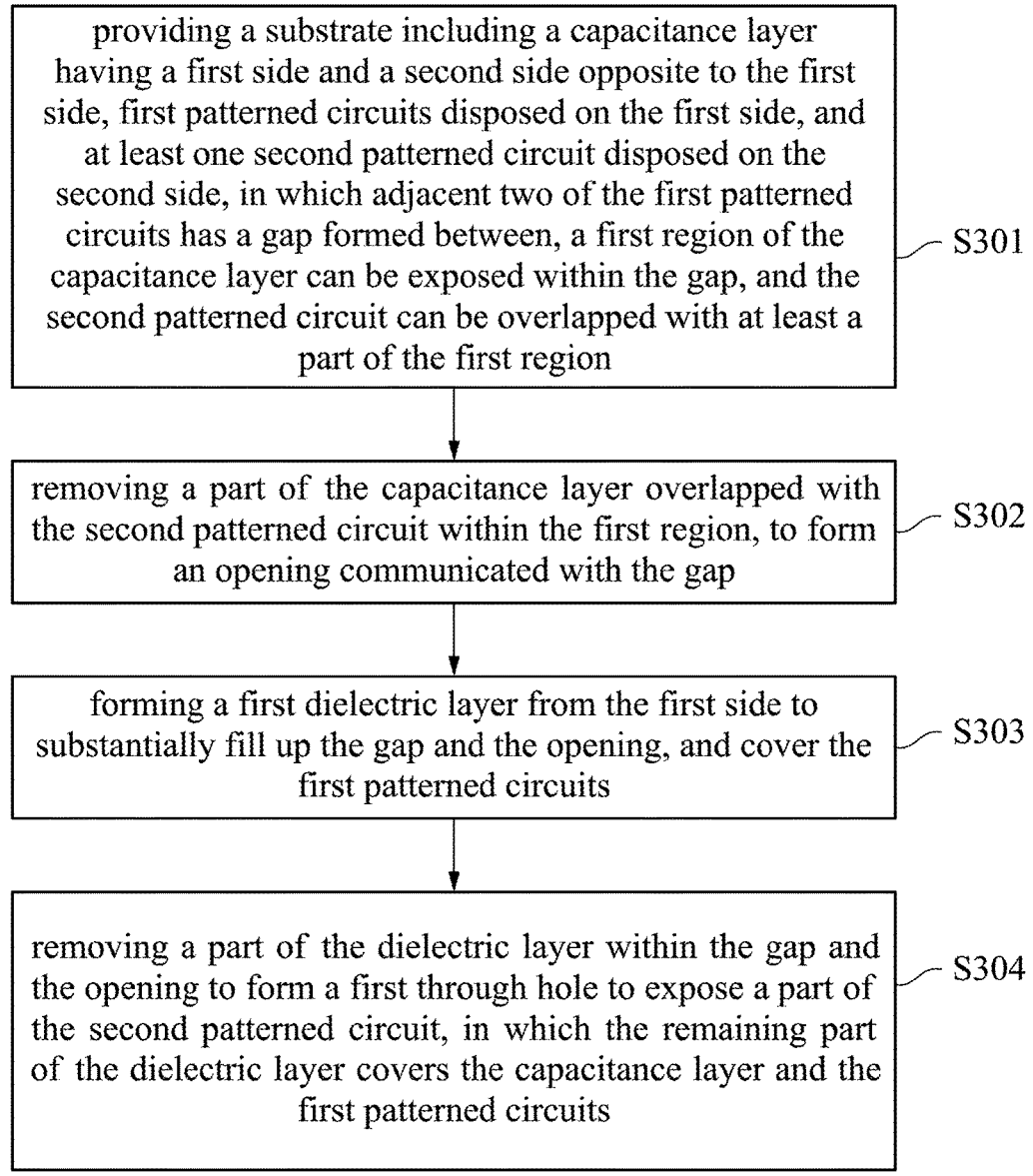
FIG. 10 is a flowchart illustrating a method for fabricating package substrate according to an embodiment of the present disclosure.

FIG. 2 to FIG. 9 illustrate simplified fragmentary cross-sectional views of a package substrate 100 at various stages of a method 300 for fabricating a package substrate in FIG. 10 according to some embodiments of the present disclosure. As shown in FIG. 2, the substrate 200 may include a capacitance layer 110, a first conductive layer 240, and a second conductive layer 260. The first conductive layer 240 is disposed on a first side 112 of the capacitance layer 110. The second conductive layer 260 is disposed on a second side 114 of the capacitance layer 110, in which the second side 114 is opposite to the first side 112. In some embodiments, the first conductive layer 240 may be disposed directly on the capacitance layer 110 from the first side 112. The second conductive layer 260 may be disposed directly on the capacitance layer 110 from the second side 114. In some embodiments, material of the capacitance layer 110 may include mixture of the Epoxy and barium titanate or other suitable materials, such as Ajinomoto Build-up film (ABF). In some embodiments, the material of the first conductive layer 240 and the second conductive layer 260 may be copper, copper alloy, silver, or other suitable conductive material.

Figure 3:
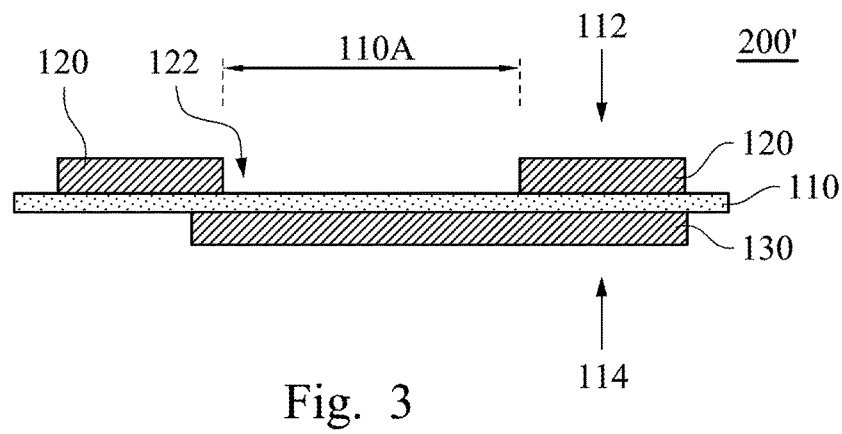

Referring to FIG. 3, in some embodiments, subsequently, the first conductive layer 240 and the second conductive layer 260 can be patterned to form a substrate 200', in which the first conductive layer 240 and the second conductive layer 260 can form the first patterned circuits 120 and the second patterned circuits 130 respectively. In some embodiments, the first patterned circuits 120 may be formed on a surface of the substrate 200' from the first side 112, and the second patterned circuits 130 may be formed on a surface of the substrate 200' from the second side 114. Two of the adjacent first patterned circuits 120 may have a gap 122 formed between, in which a first region 110A of the capacitance layer 100 is exposed. The second patterned circuit 130 is overlapped with at least a part of the first region 110A. In some embodiments, the first region 110A may be substantially fully covered by the second patterned circuit 130. It should be understood that those skilled in the art may make various changes and alterations to the substrate 200' without departing from the spirit and scope of the present disclosure to fulfill the actual demand. The prerequisite of the substrate 200' is that the capacitance layer 100 is disposed between the first patterned circuits 120 and the second patterned circuits 130.

Figure 4:
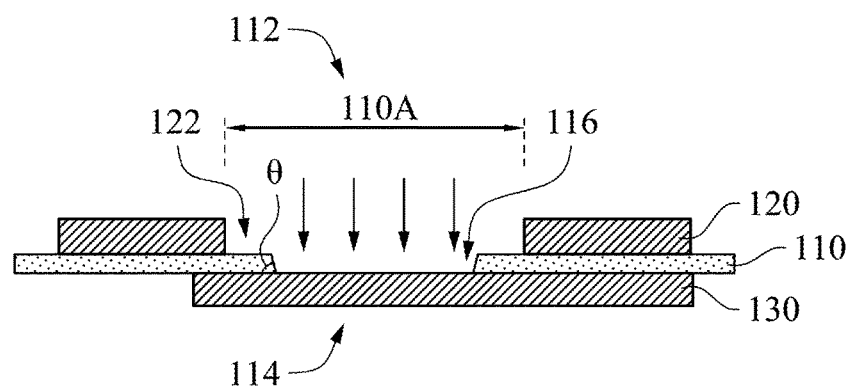

Referring to FIG. 4, in some embodiments, subsequently, at least a part of the capacitance layer 110 which overlaps with the second patterned circuit 130 within the first region 110A is removed, to form an opening 116 within the first region 110A. Consequently, the opening 116 can communicate with the gap 122. In some embodiments, the capacitance layer 110 within the first region 110A can be removed by a laser process or other suitable process. In some embodiments, the opening 116 can be substantially fully covered by the second patterned circuits 130 from the second side 114. In other embodiments, the opening 116 can be partially covered by the second patterned circuit 130. Owing to the first region 110A of the capacitance layer 110 still being uncovered while performing the drilling or removing process to form the opening 116, the formation of the opening 116 can be well controlled, especially on the end journey of forming the opening 116.

In some embodiments, an inner wall of the capacitance layer 110 defined the opening 116 has a slope surface extended into the opening 116. More specifically, owing to the restriction of the fabricating method, a first part of the slope surface proximal to the second patterned circuit 130 may be protruded from a second part of the slope surface proximal to the first patterned circuits 120. However, in the present disclosure, the inter-angle θ formed between the first part of the slope surface and a surface of the capacitance layer 110 proximal to the second patterned circuit 130 can be restricted between 30 degrees to 90 degrees. As a consequence, the restriction of the inter-angle θ can avoid a part of the slope surface protruded from the inner wall of the capacitance layer 110 defined the opening 116, or even prevent the inner wall of the opening 116 from accumulated of heats or exerted-forces generated from subsequent fabricating processes. That is, while the inter-angle θ formed between the first part of the slope surface and the surface of the capacitance layer 110 proximal to the second patterned circuit 130 is restricted for avoiding the accumulation of heats or exerted-forces, such that the opening 116 can avoid or reduce being cracked or damaged, which may be induced by the accumulated heat or exerted-forces.

Figure 5:
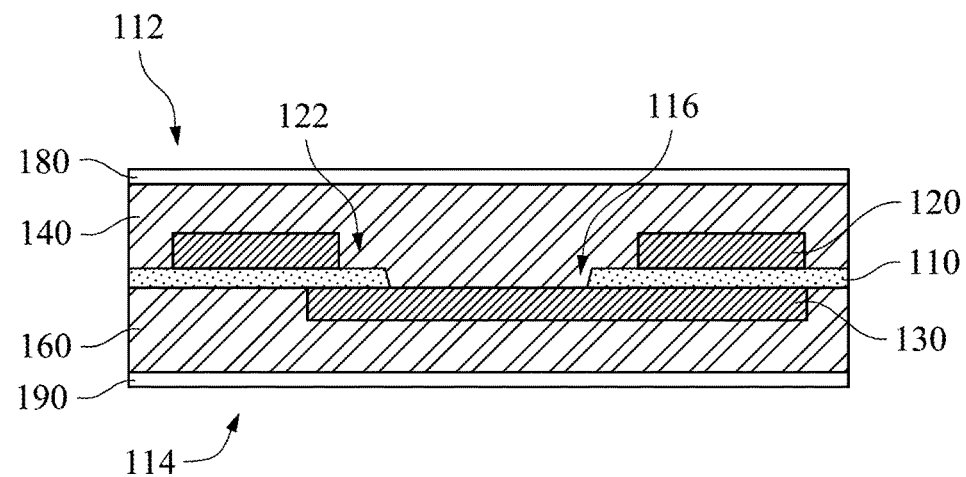
Figure 6:
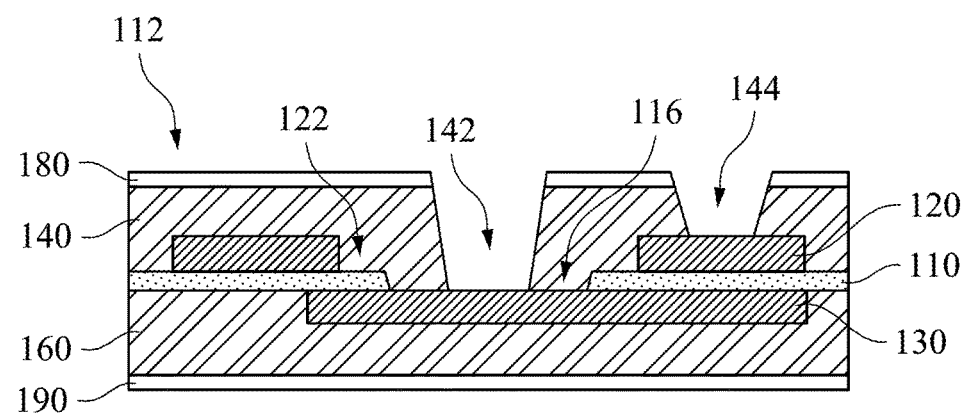

Referring to FIG. 5, in some embodiments, subsequently, a first dielectric layer 140 is formed from the first side 112 of the capacitance layer 110 to substantially fill up the gap 122 and the opening 116. In other embodiments, the first dielectric layer 140 may also be formed to cover the first patterned circuits 120. In some embodiments, the second dielectric layer 160 can be formed form the second side 114 of the capacitance layer 110 to cover the second patterned circuit 130. In some embodiments, the first dielectric layer 140 and the second dielectric layer 160 can be formed in the same process, for example, a lamination process can be performed from the first side 112 and the second side 114 of the capacitance layer 110 spontaneously to form the first dielectric layer 140 and the second dielectric layer 160 at the same time.

In other embodiments, a conductive layer 180 can further be formed on a surface of the first dielectric layer 140 away from the capacitance layer 110. The conductive layer 180 may be adopted to form at least one conductive feature on the surface of the first dielectric layer 140 away from the capacitance layer 110, such as the third patterned circuits 170. In some embodiments, the conductive layer 180 can be formed after the first dielectric layer 140 is formed. In some embodiments, material of the conductive layer 180 may include copper, copper alloy, or other suitable conductive material.

Referring to FIG. 5, in some embodiments, subsequently, a part of the first dielectric layer 140 within the gap 122 and the opening 116 can be removed to expose a part of the second patterned circuit 130 faced toward the first side 112. In some embodiment, the remaining part of the first dielectric layer 140 can cover the capacitance layer 110 and the first patterned circuits 120, and define a first through hole 142 within. That is, the second patterned circuit 130 can be exposed in the first through hole 142. In other embodiments, a part of the conductive layer 180 can be removed before a part of the first dielectric layer 140 is removed, such that the remaining part of the conductive layer 180 and the first dielectric layer 140 can form the first through hole 142 collectively.

Owing to a side wall of the capacitance layer 110 being defined the opening 116 (or slope surface in FIG. 4) and a part of the capacitance layer 110 exposed in the gap 122 can be covered by the remaining part of the first dielectric layer 140, the capacitance layer 110 may avoid being exposed. Therefore, a protruding part of the opening 116 of the capacitance layer 110 can further avoid heat or exerted-forces being accumulated, for example, the heat or the exerted-forces generated from the subsequent processes. That is, while the opening 116 is formed before the first dielectric layer 140 and the first through hole 142 are formed, such that the opening 116 can avoid or reduce being cracked or damaged, which is mainly induced by the accumulated heat or exerted-forces. Furthermore, various laser drilling techniques or other drilling techniques can be adopted, to provide the fabricating of the package substrate 100 with a greater compatibility and feasibility for adapting the hardness of the first dielectric layer 140 and the hardness of the capacitance layer 110.

In some embodiments, a part of the conductive layer 180 and the first dielectric layer 140 can be removed to form a second through hole 144 to expose the corresponded first patterned circuits 120. In some embodiments, the first through hole 142 and the second through hole 144 can be formed in the same process. In other embodiments, the first through hole 142 and the second through hole 144 can be formed in different processes.

Figure 7:
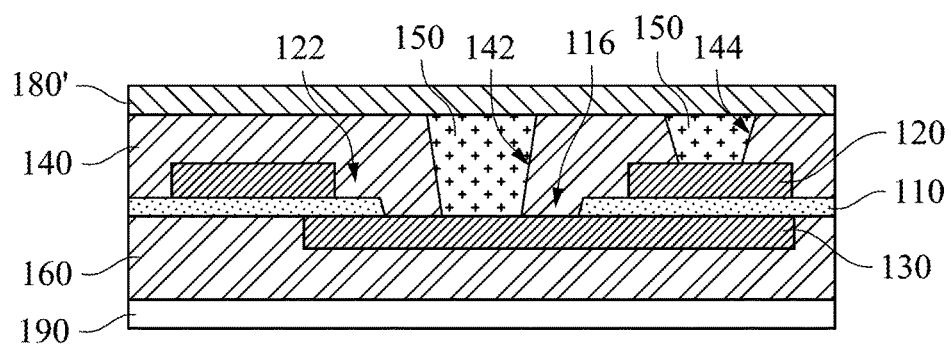

Referring to FIG. 7, in some embodiments, subsequently, a conductive material 150 may be filled into the first through hole 142. The conductive material 150 can form a first conductive route 152 inside the first through hole 142 to connect the second patterned circuit 130 onto a surface of the first dielectric layer 140 away from the capacitance layer 110. In other embodiments, the conductive material 150 may further be filled into the second through hole 144. The conductive material 150 can form a second conductive route 154 inside the second through hole 144 to connect the corresponded first patterned circuit 130 onto a surface of the first dielectric layer 140 away from the capacitance layer 110.

Owing to the first dielectric layer 140 can electrically insulate the first conductive route 152 and the second conductive route 154, and further insulate the second patterned circuit 130 and the first conductive route 152 from the first patterned circuit 130 and the second conductive route 154. Therefore, the first dielectric layer 140 can avoid or reduce the electrical signals occurred leakage or capacitive resisting while the electrical signals are transmitting through the first conductive route 152 and/or the second conductive route 154. That is, the first dielectric layer 140 disposed between the conductive material 150 and the inner wall of the opening 116 can avoid or reduce the electrical signals, transmitted through the package substrate 100, such as the first patterned circuits 120 and the second patterned circuit 130, occurred electricity leakage or electrical signal distortion, and further improve transmission quality of the electrical signals.

Referring to FIG. 7 and FIG. 8, in some embodiments, more conductive material can be deposited on the conductive layer 180, to form a conductive layer 180' on the surface of the first dielectric layer 140 away from the capacitance layer 110. Subsequently, in some embodiments, the conductive layer 180' can be patterned to form the third patterned circuits 170. The third patterned circuits 170 can connect with at least one of the first conductive route 152 and the second conductive route 154. Referring to FIG. 9, a protective layer 175 can further be formed on the third patterned circuits 170.

FIG. 10 illustrates a flowchart illustrating a method 300 for fabricating package substrate according to an embodiment of the present disclosure. As shown in FIG. 10, the method 300 begins with step S301 in which a substrate is provided. The substrate may include a capacitance layer, first patterned circuit, and a second patterned circuit. The capacitance layer has a first side and a second side opposite the first side. The first patterned circuit is disposed on the first side. The second patterned circuit is disposed on the second side. A gap can be formed between adjacent two of the first patterned circuits, and a first region of the capacitance layer can be exposed in the gap. The second patterned circuit can be overlapped with at least a part of the first region.

Subsequently, the method continues with step S302 in which a part of the capacitance layer overlapped with the second patterned within the first region is removed to form an opening communicated with the gap. Subsequently, the method continues with step S303 in which a dielectric layer can be formed from the first side to substantially fill up the gap and the opening. The dielectric layer may further cover the first patterned circuits. Subsequently, the method continues with step S304 in which a part of the first dielectric layer within the gap and the opening can be removed to form a through hole, in which a part of the second patterned circuit is exposed. The remaining part of the dielectric layer may cover the capacitance layer and the first patterned circuits. In other words, the through hole may be defined within the remaining part of the dielectric layer, and a part of the second patterned circuit is exposed in the through hole.

Summarized from the above, an embodiment of the present disclosure provides a method of fabricating package substrate. In the method, the opening inside a capacitance layer can be fabricated firstly; subsequently, the dielectric layer can be filled in the opening, within which the through hole is formed, such that the dielectric layer can cover a part of the capacitance layer exposed in the gap and the opening. As a consequence, the dielectric layer may avoid or reduce the opening of the capacitance layer being cracked or damaged in the manner which may prevent some parts of the capacitance layer protruding within the opening from accumulated the heat or the exerted-forces generated by the subsequent fabricating processes. In addition, the dielectric layer can further electric insulate between the conductive material formed within the through hole and the first patterned circuit, such that the conductive material can avoid or reduce electricity leakage and capacitive resistance occurred.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, fabricate, composition of matter, means, methods, and steps described in the specification. As one of ordinary skill in the art will readily appreciate from the disclosure of the present disclosure, processes, machines, fabricate, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, fabricate, compositions of matter, means, methods, or steps.

What is claimed is:

1. A package substrate, comprising:
a capacitance layer having a first side, a second side opposite to the first side, and an opening;
a plurality of first patterned circuits disposed on the first side, and adjacent two of the first patterned circuits having a gap formed in-between, wherein the opening is located within the gap;
at least one second patterned circuit disposed on the second side, wherein the second patterned circuit at least covers the opening;
a dielectric layer disposed on the first side, wherein the dielectric layer has a first through hole formed within, wherein the first through hole is extended through the gap and the opening, and reached the second patterned circuit; and
a conductive material disposed inside the first through hole, and extended between the second patterned circuit and a surface of the dielectric layer away from the capacitance layer,
wherein the dielectric layer is disposed between and insulate the capacitance layer and the conductive material.

2. The package substrate of claim 1, wherein a distance measured between the border of the opening and the border of the conductive material located within the first through hole is greater than or substantially equal to 5 μm.

3. The package substrate of claim 1, wherein the capacitance layer further has a side wall, surrounded and defined the first through hole, wherein the inter-angle formed between the side wall and a surface of the capacitance layer proximal to the second patterned circuit is restricted between 30 degrees to 90 degrees.

4. The package substrate of claim 1, wherein the dielectric layer further has a second through hole, formed within the dielectric layer and reached the first patterned circuit, wherein the conductive material further disposed inside the second through hole, and extended between the first patterned circuit and a surface of the dielectric layer away from the capacitance layer.

5. A method for fabricating a package substrate comprising:
providing a substrate comprising a capacitance layer, a plurality of first patterned circuits, and at least one second patterned circuit, wherein the capacitance layer has a first side and a second side opposite to the first side, the first patterned circuits are disposed on the first side, and the second patterned circuit is disposed on the second side, wherein a gap is formed between adjacent two of the first patterned circuits and exposes a first region of the capacitance layer, and the second patterned circuit is overlapped with at least a part of the first region;
removing at least one part of the capacitance layer overlapped with the second patterned circuit within the first region, to form an opening communicated with the gap;
forming a first dielectric layer from the first side to substantially fill up the gap and the opening; and
removing a part of the first dielectric layer within the gap and the opening to form a first through hole to expose a part of the second patterned circuit, wherein the remaining part of the first dielectric layer covers the capacitance layer and the first patterned circuits.

6. The method of claim 5, further comprising:
filling a conductive material into the first through hole to form a first conductive route, wherein the second patterned circuit is connected onto a surface of the first dielectric layer away from the capacitance layer through the first conductive route.

7. The method of claim 5, further comprising:
forming at least one first conductive feature on the surface of the first dielectric layer away from the capacitance layer to connect with the first conductive route.

8. The method of claim 5, wherein the forming of the first dielectric layer further forms the first dielectric layer covering the first patterned circuits, wherein the first through hole are extended above the first patterned circuits.

9. The method of claim 8, further comprising:
removing a part of the first dielectric layer covered the first patterned circuits to form a second through hole above one of the first patterned circuits for exposing the corresponded first patterned circuit.

10. The method of claim 9, further comprising:
filling a conductive material into the first through hole and the second through hole, to form a first conductive route and a second conductive route within the first through hole and the second through hole respectively, wherein the second patterned circuit and the exposed first patterned circuits are connected onto a surface of the first dielectric layer away from the capacitance layer through the first conductive route and the second conductive route respectively.

11. The method of claim 10, further comprising:
forming at least one second conductive feature on the surface of the first dielectric layer away from the capacitance layer to connect with at least one of the first conductive route and the second conductive route.

12. The method of claim 5, further comprising forming a conductive layer on the surface of the first dielectric layer away from the capacitance layer before the removing of the part of the dielectric layer, wherein the method further comprises removing a part of the conductive layer, wherein the remaining part of the conductive layer and the first dielectric layer form the first through hole collectively.

13. The method of claim 5, wherein the removing of the part of the capacitance layer further comprising forming a side wall surrounded the first through hole, wherein the inter-angle formed between the side wall and a surface of the capacitance layer proximal to the second patterned circuit is restricted between 30 degrees to 90 degrees.

14. The method of claim 5, wherein the first region is substantially fully covered by the second patterned circuit.

15. The method of claim 5, further comprising forming a second dielectric layer from the second side to cover the second patterned circuit.

\* \* \* \* \*